United States Patent
Kurniawan

(10) Patent No.: US 9,389,295 B2
(45) Date of Patent: Jul. 12, 2016

(54) HALL EFFECT SENSOR SYSTEM WITH DIAGNOSTIC CAPABILITIES

(71) Applicant: FISHER CONTROLS INTERNATIONAL LLC, Marshalltown, IA (US)

(72) Inventor: Dicky M. Kurniawan, Singapore (ID)

(73) Assignee: FISHER CONTROLS INTERNATIONAL LLC, Marshalltown, IA (US)

(*) Notice: Subject to any disclaimer, the term of this patent is extended or adjusted under 35 U.S.C. 154(b) by 158 days.

(21) Appl. No.: 14/023,201

(22) Filed: Sep. 10, 2013

(65) Prior Publication Data

US 2015/0070007 A1    Mar. 12, 2015

(51) Int. Cl.
 *G01R 35/00* (2006.01)
 *G01R 33/00* (2006.01)
 *G01R 33/07* (2006.01)

(52) U.S. Cl.
 CPC ............ *G01R 35/00* (2013.01); *G01R 33/0023* (2013.01); *G01R 33/0035* (2013.01); *G01R 33/07* (2013.01)

(58) Field of Classification Search
 None
 See application file for complete search history.

(56) References Cited

U.S. PATENT DOCUMENTS

| | | | |
|---|---|---|---|
| 4,459,584 A * | 7/1984 | Clarkson | G01F 23/46 137/558 |
| 5,483,109 A * | 1/1996 | Gholston | G01F 23/0084 307/118 |
| 5,562,132 A * | 10/1996 | Siegele | B01J 4/00 137/209 |
| 6,418,788 B2 * | 7/2002 | Articolo | G01F 23/0038 340/623 |

(Continued)

FOREIGN PATENT DOCUMENTS

DE      102011102483 A1    11/2012

OTHER PUBLICATIONS

International Search Report and Written Opinion from corresponding International Application No. PCT/US2014/054880, dated Jan. 26, 2015.

(Continued)

*Primary Examiner* — Jermele M Hollington
*Assistant Examiner* — Suresh K Rajaputra
(74) *Attorney, Agent, or Firm* — Marshall, Gerstein & Borun LLP

(57) ABSTRACT

In a method for verifying measurements obtained from a hall effect sensor in a hall effect sensor system, the hall effect sensor is excited with an excitation current having a first value. A first measurement corresponding to a voltage output of the hall effect sensor when the hall effect sensor is excited with the excitation current having the first value is obtained. Additionally, the hall effect sensor is excited with the excitation current having a second value, the second value different than the first value. A second measurement corresponding to a voltage output of the hall effect sensor when the hall effect sensor is excited with the excitation current having the second value is obtained. Operation of the hall effect sensor is then verified based at least on the first measurement and the second measurement.

19 Claims, 8 Drawing Sheets

(56) References Cited

U.S. PATENT DOCUMENTS

| | | | | |
|---|---|---|---|---|
| 6,453,741 B1* | 9/2002 | Beck, II | G01F 23/38 | 340/623 |
| 6,481,278 B1* | 11/2002 | Kaylor | G01F 23/74 | 200/84 C |
| 6,510,397 B1* | 1/2003 | Choe | F16H 57/0006 | 702/104 |
| 6,557,412 B1* | 5/2003 | Barbier | G01F 23/76 | 340/623 |
| 6,564,632 B2* | 5/2003 | Ross, Jr. | G01F 23/38 | 73/290 R |
| 6,570,380 B2* | 5/2003 | Sato | G01R 33/07 | 324/207.2 |
| 6,629,627 B1* | 10/2003 | Siegele | B01J 4/00 | 137/209 |
| 6,679,116 B2* | 1/2004 | Ross, Jr. | G01F 23/38 | 73/290 R |
| 6,690,159 B2* | 2/2004 | Burreson | G01D 5/251 | 324/207.12 |
| 6,813,946 B1* | 11/2004 | Benton | G01F 23/0038 | 73/290 R |
| 7,260,988 B2* | 8/2007 | Weber | G01F 23/24 | 340/620 |
| 7,379,800 B2* | 5/2008 | Breed | B60C 23/0425 | 324/200 |
| 7,389,688 B1* | 6/2008 | Vander Horst | G01F 23/02 | 210/86 |
| 8,549,911 B2* | 10/2013 | Rudd | G01F 23/74 | 73/313 |
| 8,915,134 B2* | 12/2014 | Giovanoni | G01F 25/0061 | 73/290 R |
| 2010/0217556 A1* | 8/2010 | Hohe | G01D 3/0365 | 702/104 |
| 2012/0116695 A1 | 5/2012 | Young et al. | | |
| 2013/0201316 A1* | 8/2013 | Binder | H04L 67/12 | 348/77 |
| 2014/0163911 A1* | 6/2014 | Rohrer | G01R 33/0029 | 702/64 |

OTHER PUBLICATIONS

"DL3 Digital Level Transmitter", Fisher Controls International LLC, Bulletin 11.2:DL3 D103193X012 (2008).

\* cited by examiner

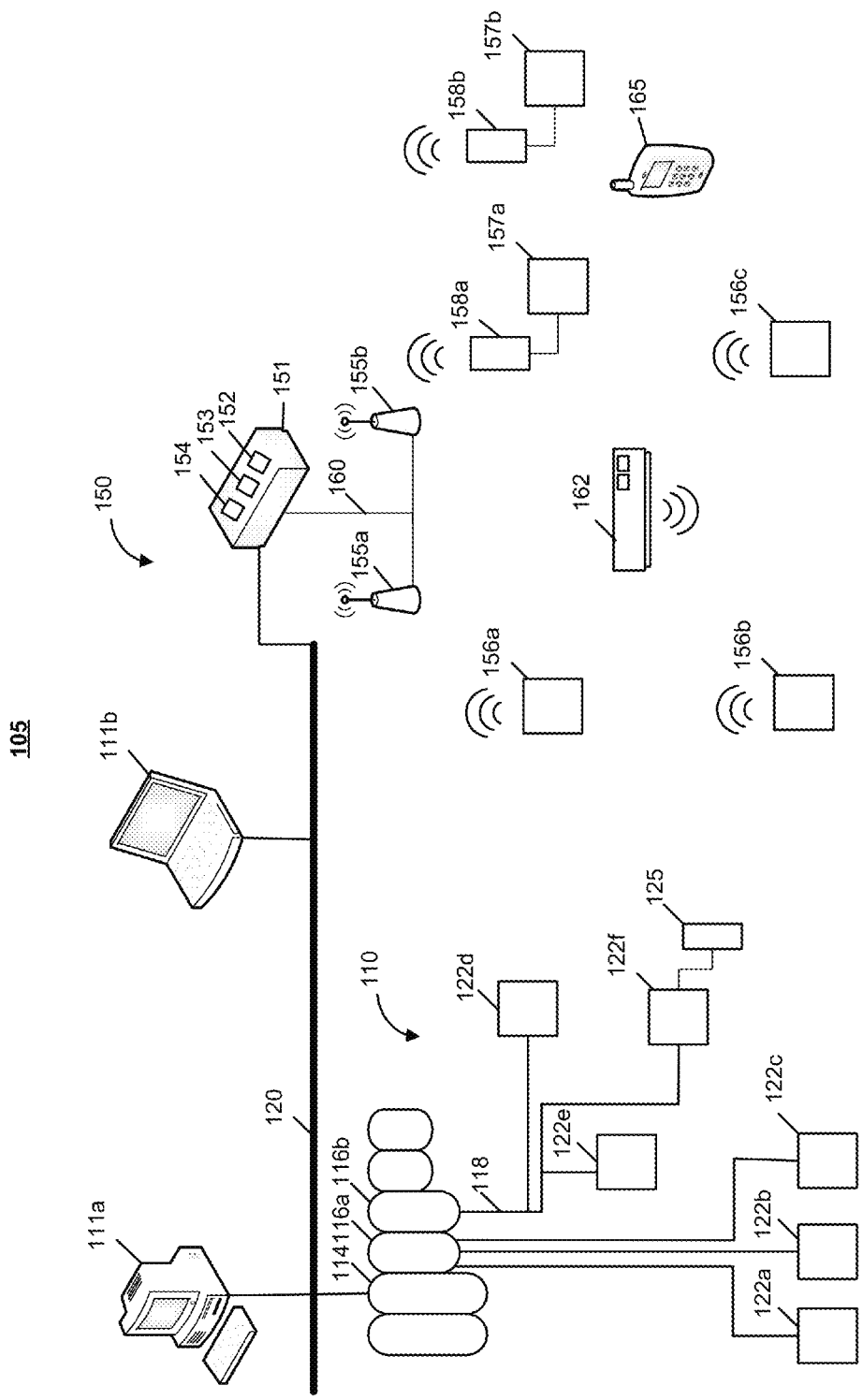

HALL EFFECT SENSOR SYSTEM WITH DIAGNOSTIC CAPABILITIES

FIELD OF THE INVENTION

The present invention relates generally to hall effect sensors and, more particularly, to diagnostics in hall effect sensor systems.

DESCRIPTION OF THE RELATED ART

Sensors are utilized in process control systems in many applications, for example in monitoring applications to monitor various process conditions and/or in control applications to provide feedback in a control loop to control a process variable. One type of sensor often employed in process control and/or monitoring applications is a hall effect sensor. A hall effect sensor typically includes a hall element, which is usually a thin sheet of metal or other conductive material, that carries a constant current. When exposed to a magnetic field, the hall element produces a voltage that is proportional to the strength of the magnetic field.

Hall effect sensors are utilized in many types of sensing devices in which a variable being sensed modulates a magnetic field. Such devices typically incorporate a magnet which may be moved or rotated in response to a change in the variable being sensed. A hall effect sensor may be utilized in a liquid level controller to provide measurements of a liquid level in a tank, or in a valve controller to provide measurements of a position of a valve. As an example, in a liquid level sensor arrangement, a magnet may be attached to a torque tube, which may in turn be attached to a displacer submerged in a liquid. A change in the level of the liquid causes a change in the displacer position. The change in the displacer position is transferred to the torque tube, which results in a rotation of the magnet attached to the torque tube thereby changing magnetic field that is sensed by the hall effect sensor.

SUMMARY

In accordance with a first exemplary aspect, a method for verifying measurements obtained from a hall effect sensor in a hall effect sensor system includes exciting the hall effect sensor with an excitation current having a first value and obtaining a first measurement corresponding to a voltage output of the hall effect sensor when the hall effect sensor is excited with the excitation current having the first value. The method further includes exciting the hall effect sensor with the excitation current having a second value, the second value different than the first value and obtaining a second measurement corresponding to a voltage output of the hall effect sensor when the hall effect sensor is excited with the excitation current having the second value. The method additionally includes verifying operation of the hall effect sensor based at least on the first measurement and the second measurement.

In accordance with a second exemplary aspect, a hall effect sensor system for use with a field device operating in a process control system comprises a hall effect sensor, a current driver coupled to the hall effect sensor, and a microcontroller coupled to the current driver. The microcontroller is configured to control the current driver to supply excitation current having a first value to the hall effect sensor, and obtain a first measurement corresponding to a voltage output of the hall effect sensor when the hall effect sensor is excited with the excitation current having the first value. The microcontroller is also configured to control the current driver to supply excitation current having a second value to the hall effect sensor, the second value different than the first value, and obtain a second measurement corresponding to a voltage output of the hall effect sensor when the hall effect sensor is excited with the excitation current having the second value. The microcontroller is additionally configured to verify operation of the hall effect sensor based at least on the first measurement and the second measurement.

In accordance with a third exemplary aspect, a process control system comprises a field device comprising a hall effect sensor system configured to measure a process variable in the processes control system. The hall effect sensor system includes a hall effect sensor, a current driver coupled to an excitation input of the hall effect sensor, and a microcontroller coupled to the current driver. The microcontroller is configured to control the current driver to supply excitation current having a first value to the hall effect sensor, and obtain a first measurement corresponding to a voltage output of the hall effect sensor when the hall effect sensor is excited with the excitation current having the first value. The microcontroller is further configured to control the current driver to supply excitation current having a second value to the hall effect sensor, the second value different than the first value, and obtain a second measurement corresponding to a voltage output of the hall effect sensor when the hall effect sensor is excited with the excitation current having the second value. The microcontroller is further configured to verify operation of the hall effect sensor based at least on the first measurement and the second measurement.

In further accordance with any one or more of the foregoing first, second, or third aspects, a hall effect sensor system, a method of verifying measurements obtained from a hall effect sensor in a hall effect sensor system, and a process control system may further include, in any combination, any one or more of the following preferred forms.

In one preferred form, verifying operation of the hall effect sensor is further based on calibration data obtained for the hall effect sensor.

In another preferred form, obtaining calibration data for the hall effect sensor includes supplying excitation current having the first value to the hall effect sensor and obtaining a plurality of measurements corresponding to a plurality of magnetic field strength values applied to the hall effect sensor as the hall effect sensor is excited at the first excitation current value.

In another preferred form, obtaining calibration data further includes supplying excitation current having the second value to the hall effect sensor and obtaining a plurality of measurements corresponding to the plurality of magnetic field strength values applied to the hall effect sensor as the hall effect sensor is excited at the second excitation current value.

In another preferred form, verifying operation of the hall effect sensor includes determining, based on stored calibration data, a value of magnetic field corresponding to the first measurement, and determining, based on stored calibration data, an expected output voltage value corresponding to the determined value of the magnetic field and to the excitation current having the second value;

In another preferred form, verifying operation of the hall effect sensor further includes comparing the second measurement obtained from the hall effect sensor and the expected output voltage value, and determining whether the hall effect sensor measurements are (i) valid or (ii) invalid based on the comparison of the second measurement obtained from the hall effect sensor and the expected output voltage value.

In another preferred form, the hall effect sensor system includes an analog front end for conditioning and digitizing hall effect sensor output signals In another preferred form, the hall effect sensor system is capable of detecting faults in the analog front end.

In another preferred form, detecting faults in the analog front end includes supplying a reference voltage to the analog front end, and obtaining, from the analog front end, a measurement corresponding to the reference voltage supplied to the analog front end.

In another preferred form, detecting faults in the analog front end further includes comparing the obtained measurement to a stored measurement obtained from the analog front end when the reference voltage is applied to the analog front end during calibration of the hall effect sensor system, and detecting a fault in the analog front end when the obtained measurement does not match the stored measurement.

In another preferred from, the hall effect sensor system is included in a field device operating in a process control system.

In another preferred form, verifying operation of the hall effect sensor includes determining that measurements obtained from the hall effect sensor are one of i) valid or ii) invalid.

In another preferred form, in response to determining that measurements obtained from the hall effect sensor are not valid, operation of the field device is automatically set to a safe mode.

In another preferred form, the field device operating in the process control system is a digital level controller.

In another preferred form, an alarm signal is communicated to a host station when it is determined that measurements obtained from the hall effect sensor are not valid.

In another preferred form, the microcontroller is configured to obtain calibration data for the hall effect sensor.

In another preferred form, the microcontroller is configured to detect faults in the analog front end.

In another preferred form, the hall effect sensor may further include a switch connected between the hall effect sensor and the analog front end, and detecting faults in the analog front end includes controlling the switch to switch input of the analog front from an output of the hall effect sensor to a reference voltage.

The field device is a digital level controller, and wherein the process variable is one of (i) level of liquid in a tank, (ii) level of interface between multiple liquids in a tank or (iii) density of a liquid in a tank.

BRIEF DESCRIPTION OF THE DRAWINGS

FIG. 8 illustrates an exemplary process control system into which a field device having a hall sensor system of the present disclosure may be incorporated.

DETAILED DESCRIPTION

Hall effect sensors are often utilized in process control systems to provide measurement of a process variable to monitor the process variable and/or to provide feedback in a control loop to control the process variable. For example, a hall effect sensor may be employed in a liquid level controller to provide feedback of a liquid level in a tank, or in a valve position controller to provide feedback of a position of a valve. In general, a hall effect sensor operates by detecting a magnetic field, generated by a magnetic flux source, such as a magnet, and producing an output voltage signal that is proportional to the strength of the magnetic field. The voltage signal produced by the hall effect sensor is generally a function of input current supplied to the hall effect sensor. Therefore, to obtain a voltage output signal that represents only the strength of the magnetic field applied to a hall effect sensor, in typical hall effect sensor applications, a regulated voltage or current source is utilized to supply a constant current to the hall effect sensor. Such hall effect sensor systems rely on the hall effect sensor's ability to accurately and consistently convert a magnetic field strength sensed by the sensor to an output voltage signal proportional to the sensed magnetic field, but generally lack capability to verify that the hall effect sensor is functioning properly and is providing accurate measurements of the process variable.

Figure 1:
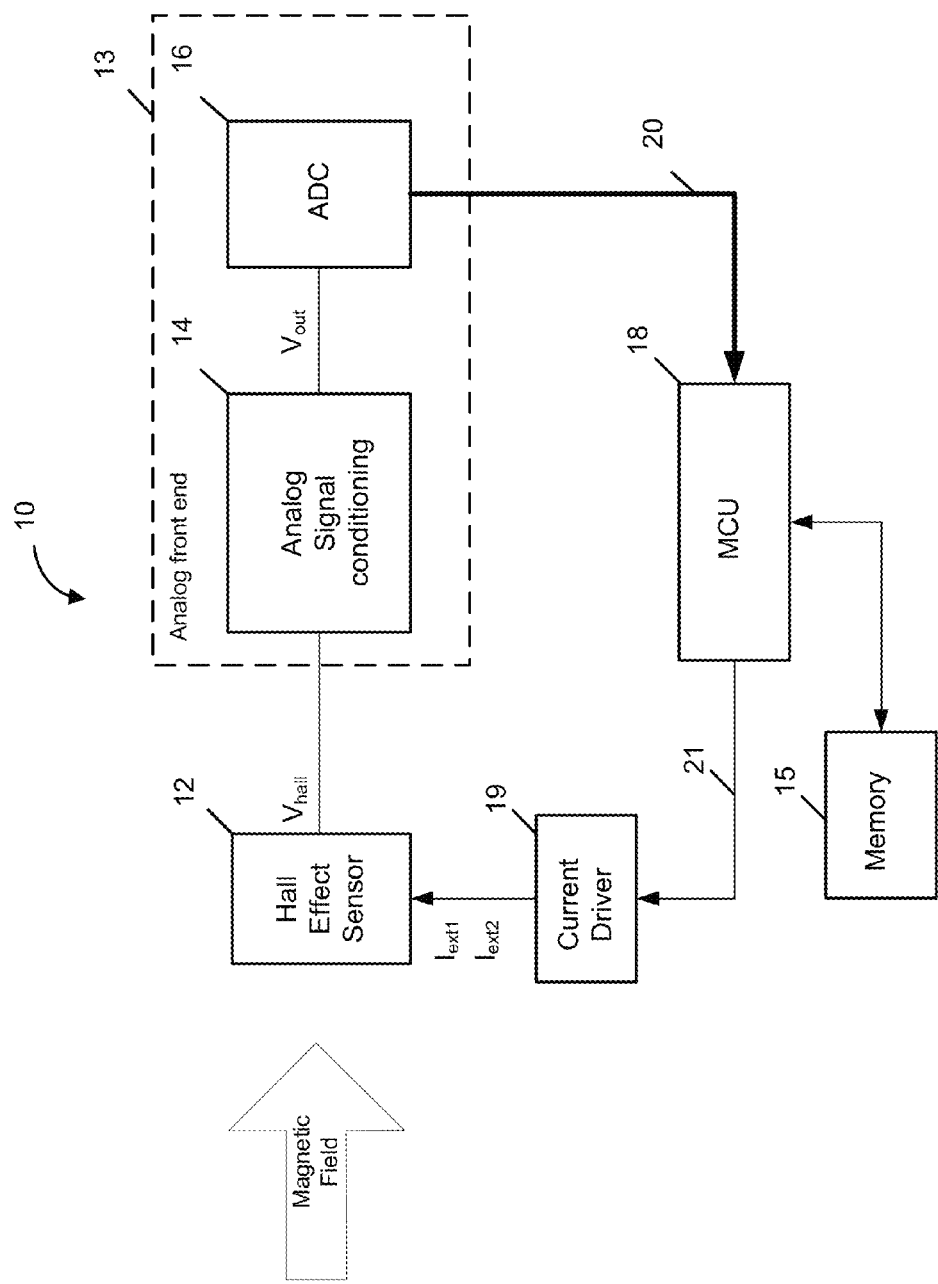
FIG. 1 is a diagram of a hall effect sensor system capable of verifying measurements obtained from a hall effect sensor, according to an embodiment.

FIG. 1 is a diagram of a hall effect sensor system capable of verifying measurements obtained from a hall effect sensor, according to an embodiment. The hall effect sensor system 10 may be included in a field device operating in a process control system, and may be used to provide measurements of a process variable within the process control system. As an example, the hall effect sensor system 10 may be included in a level controller (e.g., a digital level controller), and may provide feedback representative of a level of a liquid in a tank, a level of an interface between multiple liquids in a tank, density of a liquid in a tank, etc. As another example, in another embodiment, the hall effect sensor system 10 may be included in a valve position controller and may provide feedback representative of a position of a valve. In general, the hall effect sensor system 10 may be utilized in any sensing application in which changes in a variable being sensed can modulate a magnetic field.

The hall effect sensor system 10 is illustrated as including a hall element 12 (also referred to herein as a "hall effect sensor") coupled to an analog signal conditioning unit 14 which, in turn, is coupled to an analog to digital converter (ADC) 16. As illustrated in FIG. 1, the analog signal conditioning unit 14 and the ADC 16 comprise an analog front end of the hall effect system 10, coupled between the hall effect sensor 12 and a microprocessor unit (MCU) 18, in an embodiment A current driver 19 is coupled to an excitation input of the hall sensor 12 to supply excitation current to the hall effect sensor 12. The MCU 18 is coupled to the current driver 19 and is configured to control the current driver 19 to set the output current level of the current driver 19, and to thereby control the value of excitation current supplied to the hall sensor 12. For example, the MCU 18 may generate control signals and may transmit the control signals to the current driver 19 via a connection 21, which may be any suitable wired or wireless connection between the MCU 18 and the current driver 19, to set the output current of the current driver 19 to particular desired levels for exciting the hall effect sensor 12

Generally speaking, the hall effect sensor 12 senses a magnetic field applied to the hall effect sensor 12 and outputs a voltage signal ($V_{hall}$) proportional to the strength of the sensed magnetic field. The output voltage signal $V_{hall}$ is provided to the analog signal conditioning unit 14 which performs analog signal conditioning of the hall effect sensor output signal $V_{hall}$. For example, the analog signal conditioning unit 14 may amplify the output signal $V_{hall}$, may apply temperature compensation to the output signal $V_{hall}$ to compensate for changes in operating temperature of the hall sensor 12, may linearize the hall sensor output signal $V_{hall}$, etc. The conditioned output signal ($V_{out}$) produced by the analog signal conditioning unit 14 is provided to the ADC 16, which digitizes the output signal and provides a digitized version of the output signal to a microcontroller unit (MCU) 18 via a connection 20. The connection 20 between the ADC 16 and the MCU 18 may be a serial peripheral interface bus (SPI) connection, or any other suitable connection capable of providing a digitized signal to the MCU 18.

The MCU 18, which may be a computer such as a microcomputer having a memory and a processor therein, receives the digitized signal $V_{out}$ from the ADC 16 and, based on the value of the signal $V_{out}$, generates a signal representative of the process variable that modulates the magnetic field sensed by the hall sensor element 12. In some embodiments, prior to generating the output signal, the MCU 18 provides further conditioning to the digitized signal $V_{out}$, such as, for example, apply further temperature compensation to the digitized signal to compensate for changes in temperature of the process, for example. The output signal produced by the MCU 18 may include, for example, a 4-20 mA signal, a 0-10 VDC signal, a wireless signal, and/or a digital signal, etc that may be communicated to a control system (e.g., a host station within a control system) via a suitable communication channel. For example, in a case where the output signal is a 4-20 mA signal, a digital data communication protocol such as, for example, the well known Highway Addressable Remote Transducer (HART) protocol may be used to communicate with a control system over a wired connection. In another example, the output signal may be communicated to the control system wirelessly using a wireless HART protocol. In other examples, the output signal may be a 0-10 VDC signal, or other type of signal.

Figure 2:
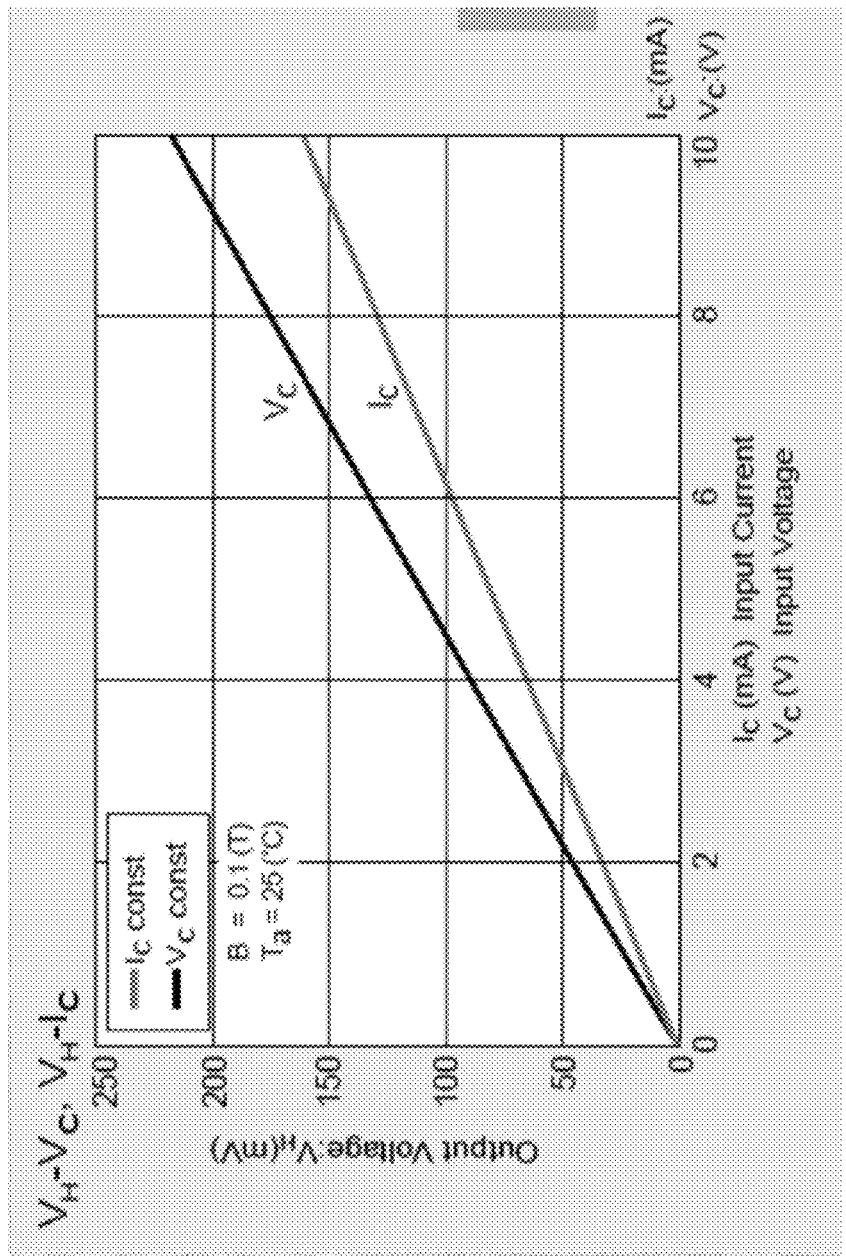
FIG. 2 is a plot illustrating a linear relationship of output voltage vs. input current for a typical hall effect sensor, such as the hall effect sensor of FIG. 1.

Generally speaking, the voltage output of a typical hall effect sensor subject to a particular magnetic field depends on, and is linearly proportional to, the input current supplied to the hall effect sensor. FIG. 2 is a plot 26 illustrating a linear relationship of output voltage vs. input current for a typical hall effect sensor, such as the hall effect sensor 12 of FIG. 1. The example plot 26 illustrates output voltage vs. input current response of a hall effect sensor when the hall effect sensor is subject to a magnetic field (B) of 0.1 Teslas (T). As illustrated in FIG. 2, the output voltage of a hall effect sensor subject to a constant magnetic field of 0.1 T is not constant but rather is linearly proportional to the input current supplied to the hall effect sensor. As an example, when 4 mA is supplied to the hall effect sensor, the output voltage produced by the hall effect sensor exposed to a 0.1 T magnetic field is equal to approximately 60 mV. On the other hand, when 6 mA is supplied to the hall effect sensor exposed to the same strength of magnetic field (i.e., 0.1 T), the output voltage of the hall effect sensor is equal to approximately 100 mV. In an embodiment, the hall sensor system 10 utilizes the linear output voltage ($V_{out}$) vs. excitation current ($I_{ext}$) property of hall effect sensors to validate measurements obtained from the hall effect sensor 12. To this end, during operation of the hall effect sensor system 10, the MCU 18 may collect measurements corresponding to the hall effect sensor output signal $V_{hall}$ hall effect sensor 12 at two or more different excitation current values supplied to the hall sensor 12, and may determine whether the obtained measurements exhibit an expected linear $V_{out}$ vs. $I_{ext}$ relationship for the hall effect sensor 12. To ensure that the collected measurements correspond to a same value to the magnetic field, these measurements should preferably be collected such that the variable being measured remains sufficiently constant in the time between the measurements are taken, in an embodiment.

Figure 3:
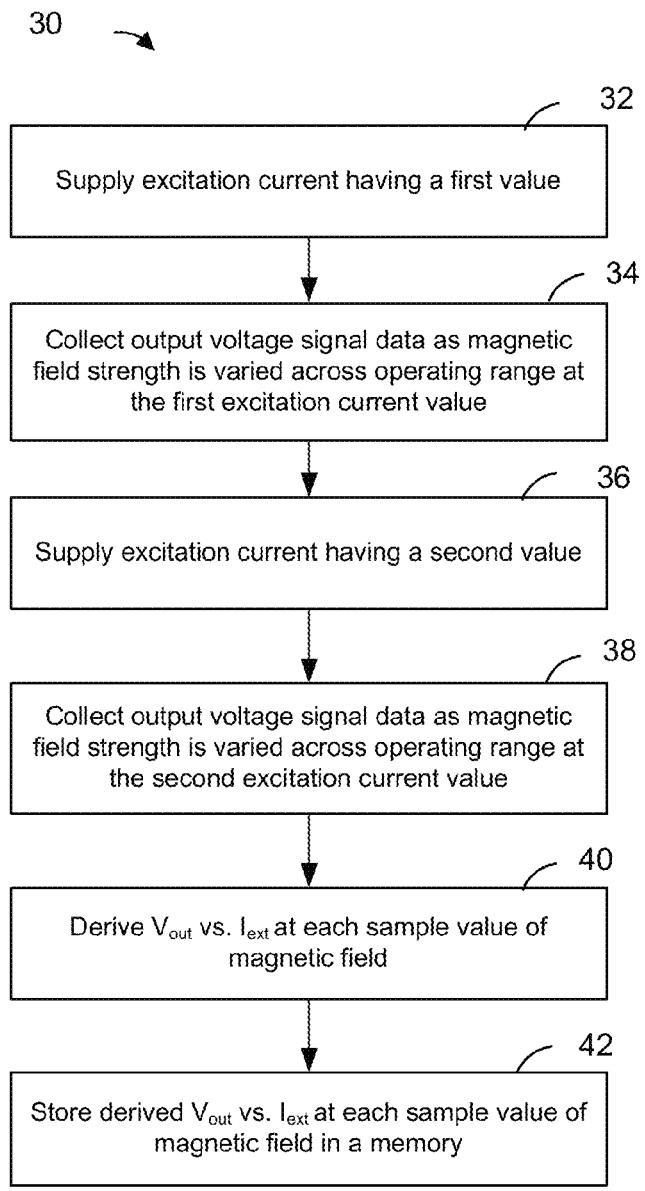
FIG. 3 is a flow diagram of an example calibration procedure 30, according to an embodiment.

To allow the MCU 18 to subsequently validate measurements received from the hall effect sensor 12 based on two or more measurements obtained from the hall effect sensor 12, calibration data characterizing the expected behavior of the hall effect sensor 12 may first be collected by, or provided to, the MCU 18. Such calibration data may be obtained during factory calibration of the hall effect sensor system 10 (or of the device that includes the hall effect sensor system 10), and may be stored in the memory 15, for example. Additionally or alternatively, calibration or re-calibration of the sensor system 10 may be conducted at field installation of a field device that includes the system 10 or during field operation of the field device to obtain calibration data characterizing the expected behavior of the hall effect sensor 12, in some embodiments. FIG. 3 is a flow diagram of an example calibration procedure 30 used to obtain calibration data characterizing expected behavior of a hall effect sensor, according to an embodiment. In an embodiment, the calibration procedure 30 is conducted to collect calibration data characterizing expected behavior of the hall effect sensor 12. At block 32, excitation current $I_{ext}$ having a first value is supplied to the hall effect sensor 12. The first excitation current value may be 6 mA, for example, or may be any other suitable value. At block 34, digitized output voltage $V_{out}$ measured at the first excitation current value is collected as the magnetic field applied to the hall effect sensor 12 is varied over the operating range of the hall effect sensor 12. For example, in a case where magnetic field applied to the hall effect sensor 12 is varied via a rotation of a magnet, output voltage $V_{out}$ measurements may be obtained from the hall effect sensor 12 at the excitation current $I_{ext}$ having the first value as the magnet that generates the magnetic field applied to the hall effect sensor 12 is rotated over the operating range of the magnet rotation, such as, for example, from −6 degrees to +6 degrees. Accordingly, an output voltage $V_{out}$ measurement may be obtained at each of a plurality of angle rotation sample points, as the hall effect sensor 12 is excited with the excitation current $I_{ext}$ having the first value, over the operating range of the rotation of the magnet that applies the magnetic field to the hall effect sensor 12. The measurements obtained at block 34 may be stored in a memory included in or coupled to the MCU 18, such as in the memory 15. In an embodiment, data collected at block 34 provides a first set of measurements points used to characterize the expected behavior of the hall effect sensor 12 over the operating range of the hall effect sensor 12.

At block 36, excitation current having a second value is supplied to the hall effect sensor 12. The second value of the excitation current may be 4 mA, for example, or any other suitable value different than the first value of the excitation current $I_{ext}$ supplied at block 32. At block 38, digitized output voltage $V_{out}$ measured at the first excitation current value is collected as the magnetic field applied to the hall effect sensor 12 is varied over the operating range of the hall effect sensor 12. For example, in a case where magnetic field applied to the hall effect sensor 12 is varied via a rotation of a magnet, output voltage $V_{out}$ measurements may be obtained from the hall effect sensor 12 at the excitation current $I_{ext}$ having the second value as the magnet that generates the magnetic field applied to the hall effect sensor 12 is rotated over the operating range of the magnet rotation, such as, for example, from −6 degrees to +6 degrees. Accordingly, an output voltage $V_{out}$ measurement may be obtained at each of a plurality of angle rotation sample points, as the hall effect sensor 12 is excited with the excitation current $I_{ext}$ having the second value, over the operating range of the rotation of the magnet that applies the magnetic field to the hall effect sensor 12. The measurements obtained at block 34 may be stored in a memory included in or coupled to the MCU 18, such as in the memory 15. In an embodiment, data collected at block 38 provides a second set of measurement points that, along with the first set of measurement points obtained at block 34, allows the MCU 18 to characterize expected behavior of the hall effect sensor 12 at different excitation currents supplied to the hall effect sensor 12 over the operating range of the hall effect sensor 12.

At block 40, $V_{out}$ vs $I_{ext}$ relationships characterizing expected behavior of the hall effect sensor 12 is derived, for each of the plurality of sample points, based on corresponding measurements in the first set of measurements obtained at block 34 and in the second set of measurements obtained at block 38. For example, for each of the plurality of sample points, a slope of a line traversing the first $V_{out}$ measurement at the first excitation current value obtained at block 34 and the second $V_{out}$ measurement at the second excitation current value obtained at block 38 may be determined at block 40. At block 42, the $V_{out}$ vs. $I_{ext}$ relationships calculated at block 38 may be stored in a memory included in or coupled to the MCU 18, such as in the memory 15, and may subsequently be used by the MCU 18 to validate measurements obtained from the hall effect sensor 12 during diagnostics of the system 10 and/or during on-line operation of the field device that includes the system 10. In some embodiments, block 40 is omitted, and the MCU 18 may subsequently utilize the $V_{out}$ measurements stored in the memory at block 34 and block 38 directly to validate measurements obtained from the hall effect sensor 12 during diagnostics of the system 10 and/or during on-line operation of the field device that includes the system 10.

Figure 4:
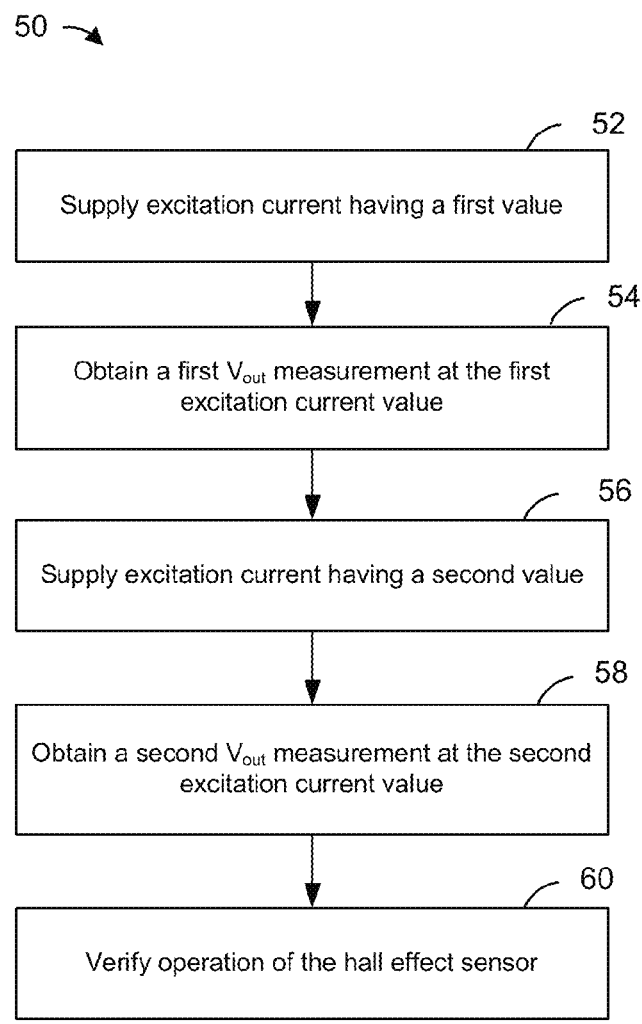
FIG. 4 is a flow diagram of a verification procedure that may be performed to verify operation of a hall effect sensor and to validate measurements obtained from the hall effect sensor, according to an embodiment.

FIG. 4 is a flow diagram of a verification procedure 50 that may be performed to verify measurements obtained from a hall effect sensor, according to an embodiment. Referring to FIG. 1, in an embodiment, the procedure 50 may be implemented by the MCU 18 to verify measurements obtained from the hall effect sensor 12. The verification procedure 50 may be conducted during diagnostics of the hall effect sensor system 10 or during on-line operation of the field device that includes the hall effect sensor system 10. For example, a verification routine may be stored in a memory, such as the memory 15, and may be executed by the MCU 18 to conduct the procedure 50 during diagnostics or during on-line operation of the sensor system 10. Such verification routine may be executed by the MCU 18 at predetermined times and/or time intervals, or may be executed upon initiation by a user when verification of the hall sensor 12 is needed or desired.

At block 52, excitation current having a first value $I_{ext}$ is supplied to the hall effect sensor 12. The first value of the excitation current $I_{ext}$ may be 6 mA, for example, or may be any other suitable value. At block 54, a first $V_{out}$ measurement is obtained from the hall effect sensor 12 corresponding to the first excitation current value supplied to the hall effect sensor 12. At block 56, excitation current $I_{ext}$ having a second value is supplied to the hall effect sensor 12. The first value of the excitation current $I_{ext}$ may be 4 mA, for example, or may be any other suitable value different than the first value of the excitation current $I_{ext}$. At block 58, a second $V_{out}$ measurement is obtained from the hall effect sensor 12 corresponding to the second excitation current value supplied to the hall effect sensor 12. At block 60, operation of the hall effect sensor is verified. In an embodiment, verification performed at block 60 is based on the first $V_{out}$ measurement obtained at block 54 and the second $V_{out}$ measurement obtained at block 58. In an embodiment, verification performed at block 60 is further based on stored calibration data characterizing expected behavior of the hall effect sensor 12, such as calibration data obtained according to the calibration procedure 30 of FIG. 3. In general, various verification routines may be implemented at block 60 to verify operation of the hall effect sensor 12 (e.g., to verify measurements obtained from the hall effect sensor 12) based on the first $V_{out}$ measurement obtained at block 54 and the second $V_{out}$ measurement obtained at block 58. An example verification scheme implemented at block 60 is described below in connection with FIG. 5.

Figure 5:
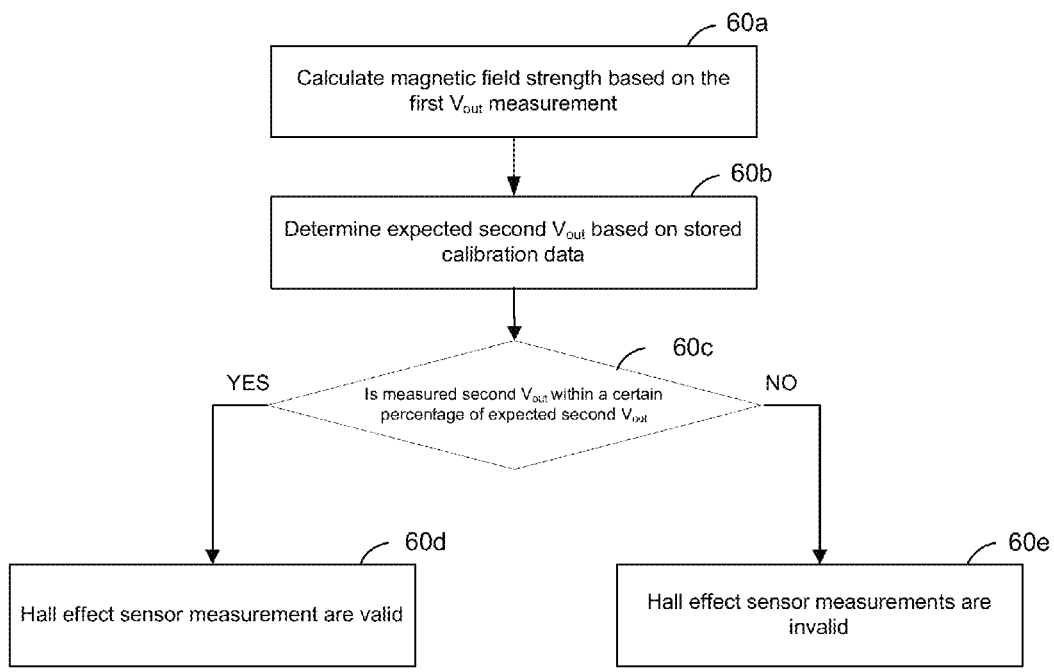
FIG. 5 is a flow diagram of one possible implementation a verification scheme implemented in the verification procedure of FIG. 4.

FIG. 5 is a flow diagram of one possible implementation a verification scheme conducted at block 60 of FIG. 4. At block 60a, a magnetic field strength corresponding to the first $V_{out}$ measurement is determined. Determining the magnetic field strength may comprise accessing stored data correlating $V_{out}$ to magnetic field strengths at the first excitation current value supplied to the hall sensor 12, for example. At block 60b, an expected value for the second $V_{out}$ measurement at the second excitation current value is calculated based on stored calibration data characterizing expected behavior of the hall effect sensor 12. For example, a slope of a line characterizing the relationship of $V_{out}$ vs. $I_{ext}$ corresponding to the magnetic field determined at block 60a is utilized to determine the expected value of $V_{out}$ with excitation current having the second value supplied to the hall effect sensor 12. At block 60c, it is determined whether the measured value of $V_{out}$ obtained at block 54 is within a certain percentage of the expected value of $V_{out}$ determined at block 58. For example, a mathematical difference between the measured value of $V_{out}$ obtained at block 54 and the expected valued of $V_{out}$ determined at block 58 may be calculated and compared to a predetermined threshold. When the mathematical difference is less than or equal to the predetermined threshold, it may be determined at bock 60d that the measurements obtained from the hall effect sensor 12 are valid. In this case, it may be concluded that the hall effect sensor is functioning properly. On the other hand, when the mathematical difference is greater than the predetermined threshold, it may be determined at block 60e that the measurements obtained from the hall effect sensor 12 are not valid. In this case, a malfunction of the hall effect sensor 12 may be detected. As another example, a ratio of the measured value of $V_{out}$ obtained at block 54 and the expected valued of $V_{out}$ determined at block 58 may be determined at block 60c, and the ratio, rather than a mathematical difference, may be compared to a predetermined threshold. In any event, when it is determined at block 60c that the measured value of $V_{out}$ is within the certain percentage of the expected value of $V_{out}$, measurement of the hall effect sensor is deemed to be valid at block 60d. On the other hand, when it is determined at block 60c that the measured value of $V_{out}$ is not within the certain percentage of the expected value of $V_{out}$, hall sensor measurement is deemed to be invalid at block 60e.

In an embodiment, upon detecting a malfunction of the hall effect sensor 12, the MCU 18 may cause an alarm signal indicating that the hall effect sensor 12 is not functioning properly to be transmitted to a control system and/or may cause an indication of the malfunction to be displayed to a user locally at the field device that includes the hall effect sensor system 10. Additionally or alternatively, the MCU 18 may be configured to set the output of the hall effect sensor system 10 to a safe output state and/or may set operation of the field device that includes the hall effect sensor system 10 to a safe state, in an embodiment.

Figure 6:
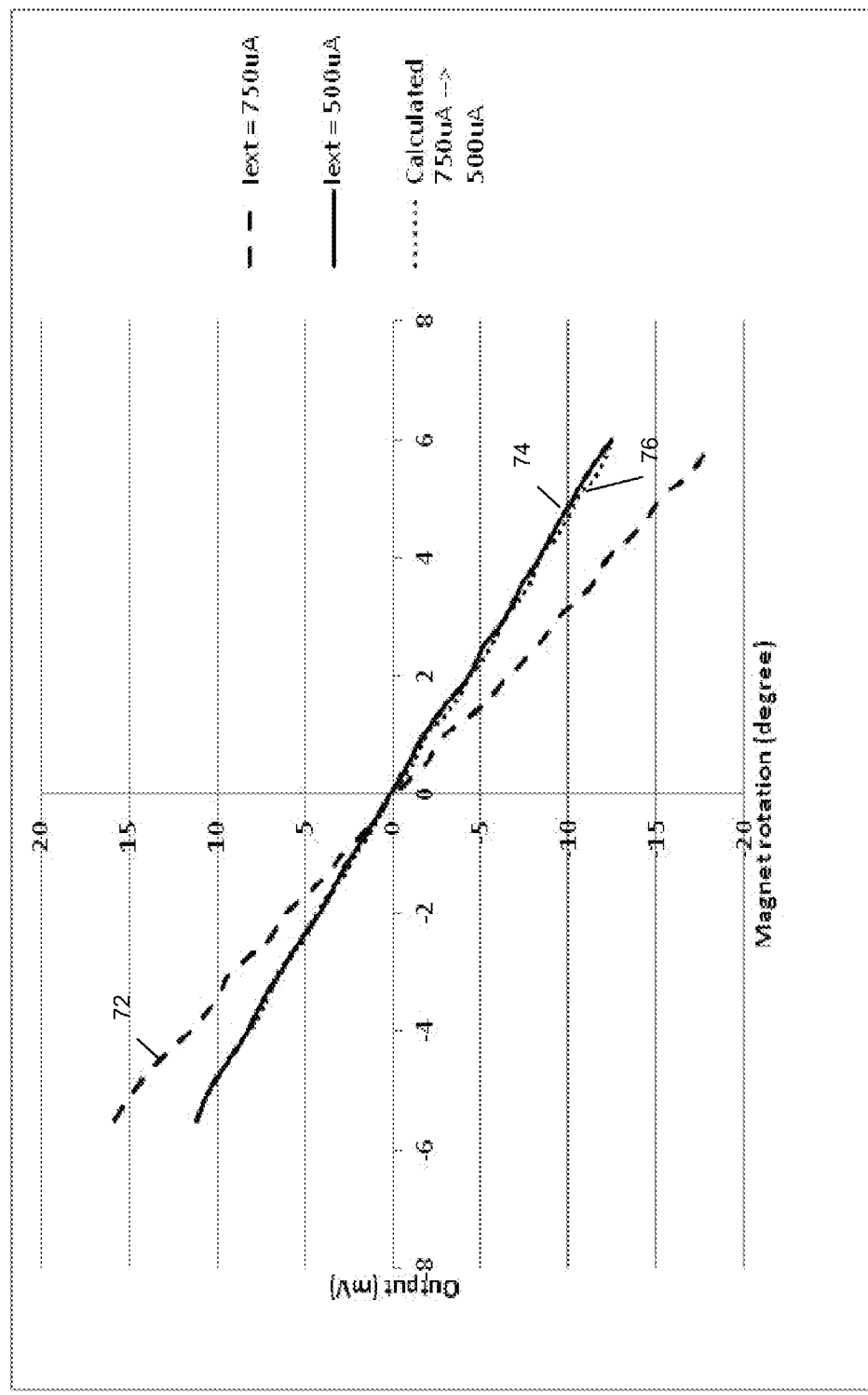
FIG. 6 is a plot illustrating a comparison between calculated and measured response of a hall effect sensor.

FIG. 6 are plots 72, 74 and 76 illustrating a comparison between calculated, or expected, response of a hall effect sensor and measured response of the hall effect sensor over a range of magnetic field strengths applied to the hall effect sensor. In particular, the plot 72 corresponds to measured output voltage of the hall effect sensor when the hall effect sensor is excited with excitation current having a first value, which in the example of FIG. 6 is equal to 750 μA. The plot 74 corresponds to expected output voltage response of the hall effect sensor when the hall effect sensor is excited with excitation current having a second value, which in the example of FIG. 6 is equal to 500 μA, calculated based on the measured output voltage response corresponding excitation current having the first value, or 750 μA (depicted in plot 72). Further, the plot 76 corresponds to the actual measured output voltage response of the hall effect sensor when the hall effect sensor is excited with excitation current having the first value, or 500 μA. As can be seen from the plots 74 and 76, the calculated, or expected, response of the output voltage of the hall effect sensor depicted in plot 74 is at least substantially the same as the measured response of the output voltage of the hall effect sensor depicted in plot 76. Accordingly, plots 74 and 76 illustrate that measurements obtained from a hall effect sensor may be accurately verified based on two measurements obtained from the hall effect sensor at two values of excitation currents supplied to the hall effect sensor.

Figure 7:
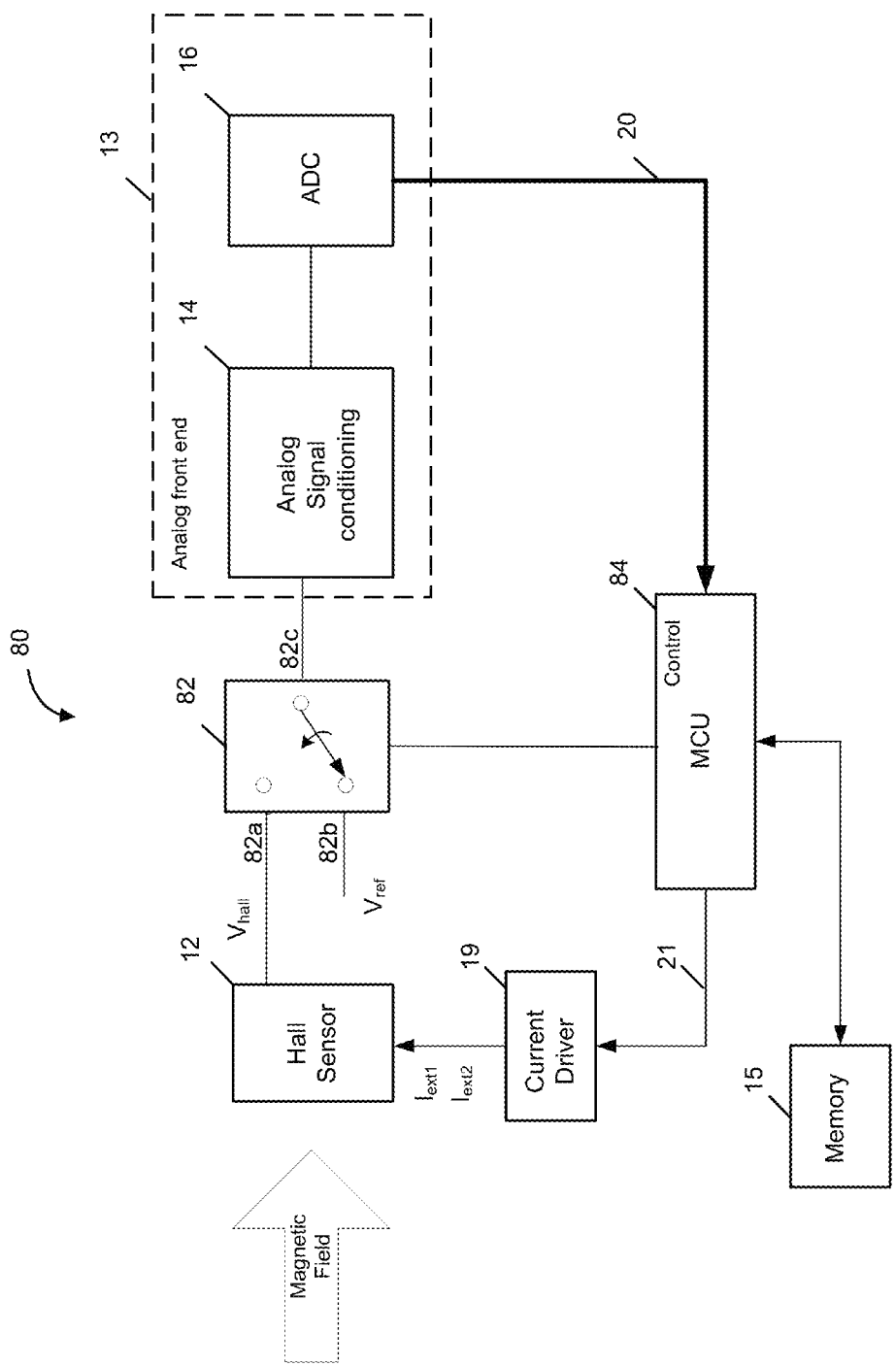
FIG. 7 is a block diagram of a hall effect sensor system having diagnostic capabilities, according to another embodiment.

FIG. 7 is a block diagram of a hall effect sensor system 80 having diagnostic capabilities, according to another embodiment. The hall effect sensor system 80 is similar to the hall effect sensor system 10 of FIG. 1 and includes some elements same as or similar to elements of the hall effect sensor system 10 of FIG. 1. Because some elements of the illustrated examples of FIG. 7 are identical to those discussed above in connection with FIG. 1, the description of identical elements is not repeated here. Instead, identical elements are illustrated with identical reference numerals in FIG. 7, and the interested reader is referred back to the descriptions presented above in connection with FIG. 1 for a complete description of those like-numbered elements.

The hall effect sensor system 80 includes an MCU 84 that is similar to and may include functionality of the MCU 18 of FIG. 1. Accordingly, the MCU 84 may be capable of verifying measurements obtained from the hall effect sensor 12 by implementing the verification procedure 50 of FIG. 5, for example. In addition, or instead of, detecting malfunction of the hall effect sensor 12, the MCU 84 is capable of detecting faults in the analog front end 13 of the hall effect sensor system 80. Faults in the analog front end 13 of the hall effect sensor system 80 may include malfunctions within the analog signal conditioning unit 14, malfunctions within the ADC 16, or faults within the connection 20 between the ADC 16 and the MCU 84, for example.

As illustrated in FIG. 7, the hall effect sensor system 80 includes a switch 82 having input terminals 82a and 82b and an output terminal 82c. The input terminals 82a and 82b of the switch 82 are coupled, respectively, the hall effect sensor 12 and an externally supplied reference voltage, and the output terminal 82c of the switch 82 is coupled to the analog signal conditioning unit 14. To detect faults in the analog front end 13 of the hall effect sensor system 80, the MCU 84 may be configured to control the switch 82 to direct a reference voltage $V_{ref}$ supplied to the analog signal conditioning unit 14 via the input 82b of the switch 82. An expected signal produced by the ADC 16 in response when the voltage $V_{ref}$ is supplied to the signal conditioning unit 14 may be determined prior to performing diagnostics to detect possible faults in the analog front end 13. For example, during calibration of the hall effect sensor system 80, the MCU 84 may control the switch 82 to switch the input 82b to supply $V_{ref}$ to the analog conditioning unit 14 and may obtain a measurement from the ADC 16 when $V_{ref}$ is supplied to the analog conditioning unit 14. The measurement obtained during calibration of the system 80 may be stored in a memory included in or associated with the MCU 18, such as in the memory 15.

Then, to verify operation of the analog front end 13 and to detect possible faults in the analog front end 13, such as during a diagnostic routine implemented by the MCU 84, the MCU 84 may switch the input of the analog signal conditioning unit 14 to the voltage $V_{ref}$ supplied by the MCU 84 and may obtain a measurement from the ADC 16 when $V_{ref}$ is supplied to the analog signal conditioning unit 14. The MCU 84 may then compare the measurement obtained from the ADC 16 to the stored measurement obtained during calibration of the hall sensor system 80. Based on the comparison, the MCU 84 may validate operation of the analog front end 13 or may detect a fault in the analog front end 13. For example, the MCU 84 may determine that the analog front end 13 is functioning properly when the measured value obtained from the ADC 16 value matches the stored value obtained during calibration of the system 80, or is within a certain percentage of the stored value obtained during calibration. On the other hand, when the measured value obtained from the ADC 16 value does not match the stored value obtained during calibration of the system 80, or is not within the certain percentage of the stored value obtained during calibration, the MCU 84 may determine that the analog front end 13 is not functioning properly and, accordingly, may detect a fault in the analog front end 13. To determine whether the measured value obtained from the ADC 16 value is within a certain percentage of the stored value obtained during calibration of the system 80, the MCU 84 may, for example, calculate a mathematical difference between the measured value obtained from the ADC 16 value and the stored value obtained during calibration, and may compare the mathematical difference to a predetermined threshold. As another example, the MCU 84 may calculate a ratio between the measured value obtained from the ADC 16 value and the stored value obtained during calibration, and may compare the ratio to a predetermined threshold.

In an embodiment, upon detecting a fault in the analog front end 13, the MCU 84 may cause an alarm signal indicating a fault in the analog front end 13 to be transmitted to a host and/or may cause an indication of the malfunction to be displayed to a user locally at the field device that includes the hall effect sensor system 80. Additionally or alternatively, the MCU 84 may be configured to set output set operation of the field device that includes the hall effect sensor system 80 to a safe state, in an embodiment.

FIG. 8 illustrates an exemplary process control system 100 into which a field device having a hall sensor system of the present disclosure may be incorporated. For example a field device, such as a liquid level controller, that includes the hall effect sensor system 10 of FIG. 1 or the hall effect sensor system 80 of FIG. 7 may be incorporated into a process control system such as the process control system 100. Referring to FIG. 8, the process control system 100 includes a wired plant automation network 110 that operates according to an industrial automation protocol (e.g., HART, PROFIBUS DP (Decentralized Peripherals), etc.) or another suitable communication protocol, and a wireless plant automation network 150 that operates according to a suitable wireless communication protocol (e.g., WirelessHART, ISA100.11a, a Wi-Fi protocol, a wireless personal area network (WPAN) protocol, a proprietary wireless protocol, etc.), or another suitable wireless communication protocol. In various embodiments, the wired plant automation network 110 or the wireless plat automation network 150 may be utilized to communicate fault signals from a field device to a host station upon detection of a fault within a hall effect system included in the field device.

The wired plant automation network 110 includes one or more controllers 114 connected to one or more host workstations or computers 111 (which may be any type of personal computer or workstation) and connected to banks of input/output (I/O) devices 116 each of which, in turn, is connected to one or more field devices 122. The controllers 114, which may be, by way of example only, DeltaV™ controllers sold by Fisher-Rosemount Systems, Inc., are communicatively coupled to the host computers 111 via, for example, an Ethernet connection 120 or other communication link. Likewise, the controllers 114 are communicatively coupled to the field devices 122 using any suitable hardware and software associated with, for example, standard 4-20 ma devices and/or any smart communication protocol such as the Fieldbus or HART protocols. As is generally known, the controllers 114 implement or oversee process control routines stored therein or otherwise associated therewith and communicate with the devices 122 to control a process in any desired manner.

The field devices 122 may be any types of devices, such valves, valve positioners, switches, sensors (e.g., temperature, pressure, vibration, flow rate, or pH sensors), pumps, fans, etc., or combinations of two or more of such types, while the I/O cards within the card bank 116 may be any types of I/O devices conforming to any suitable communication or controller protocol such as HART, Fieldbus, Profibus, etc. Field devices 122 perform control, monitoring, and/or physical functions within a process or process control loop, such as opening or closing valves or taking measurements of process parameters, for example. In the embodiment illustrated in FIG. 8, the field devices 122a-122c are standard 4-20 ma devices that communicate over analog lines to the I/O card 116a. In another embodiment, the field devices 112a-122c are Hart devices and the I/O card 116a is a Hart compatible I/O card. In one embodiment, the control system 100 includes 4-20 ma devices as well as Hart devices. Accordingly, in this embodiment, the control system 100 includes one or more 4-20 ma compatible I/O cards as well as one or more Hart compatible I/O cards.

In the embodiment of FIG. 8, the field devices 122d-122f are smart devices, such as Fieldbus field devices, that communicate over the digital bus 118 to the I/O card 118 using, for example, Fieldbus protocol communications. Of course, the field devices 122 and the banks of I/O cards 116 could conform to any other suitable standard(s) or protocols besides the 4-20 ma, HART or Fieldbus protocols, including any standards or protocols developed in the future.

Each of the controllers 114 is configured to implement a control strategy using what are commonly referred to as function blocks, wherein each function block is a part (e.g., a subroutine) of an overall control routine and operates in conjunction with other function blocks (via communications called links) to implement process control loops within the process control system 100. Function blocks typically perform one of an input function, such as that associated with a transmitter, a sensor or other process parameter measurement device, a control function, such as that associated with a control routine that performs PID, fuzzy logic, etc. control, or an output function that controls the operation of some device, such as a valve, to perform some physical function within the process control system 100. Of course hybrid and other types of function blocks exist. Groups of these function blocks are called modules. Function blocks and modules may be stored in and executed by the controller 12, which is typically the case when these function blocks are used for, or are associated with standard 4-20 ma devices and some types of smartfield devices, or may be stored in and implemented by the field devices themselves, which may be the case with Fieldbus devices. While the description of the control system is provided herein using function block control strategy, the control strategy could also be implemented or designed using other conventions, such as ladder logic, sequential flow charts, etc. and using any suitable proprietary or non-proprietary programming language.

As discussed above, the process control system 100 also includes the wireless communication network 150 that utilizes or operates according to a suitable wireless communication protocol. For clarity, the discussion herein refers to the WirelessHART communication protocol, although the techniques and principles described herein may apply to wireless plant automation networks that utilize other wireless industrial automation protocols in addition to or instead of WirelessHART, or to networks that utilize only wired communications.

The wireless communication network 150 includes a gateway 151 connected to the communication backbone 120 in a wired manner and may communicate with the host stations 111 using a suitable protocol. The gateway 151 may be implemented as a stand-alone device, as a card that can be inserted into an expansion slot of one of the host workstations 111, as part of an input/output (I/O) subsystem of a programmable logic controller (PLC) system or distributed control system (DCS), or in any other manner. The gateway 151 may provide host stations 111, and applications executed thereon, access to various devices of the wireless plant automation network 150. In addition to protocol and command conversion, the gateway 151 may provide synchronized clocking that is used by time slots and superframes (i.e., sets of communication time slots that are spaced equally in time) of the scheduling scheme of the wireless plant automation network 150.

In some embodiments, the gateway 151 is functionally divided into a virtual gateway 152 and one or more network access points 155. In the process control system 100 shown in FIG. 8, the network access points 155 are separate physical devices in wired communication with the gateway 151. Alternatively, the elements 151, 152, 155 and 158 may instead be parts of an integral device, and/or the connections 158 may be wireless connections. Physically separate network access points 155 may be strategically placed in several distinct locations, thereby increasing the overall reliability of the communication network 100 by compensating for poor signal quality at the location of one or more of the network access points 155. Having multiple network access points 155 also provides redundancy in case of failure of one or more of the network access points 155.

The gateway device 151 may additionally contain a network manager software module 153 and a security manager software module 154. In another embodiment, the network manager software module 153 and/or the security manager software module 154 may run on a host workstation 111. For example, the network manager software module 153 may run on the stationary host workstation 111a and the security manager software module 154 may run on the portable host workstation 111b. The network manager software module 153 may be responsible for tasks such as configuration of the communication network 100, scheduling of communications between multiple WirelessHART devices (e.g., configuring superframes), management of routing tables, and monitoring and reporting of the health of the wireless plant automation network 150, for example. While redundant network manager software modules 153 may be supported, an example embodiment includes only one active network manager software module 153 per wireless plant automation network 150. The security manager software module 154 may be responsible for managing and distributing security encryption keys, and may maintain a list of devices that are authorized to join the wireless plant automation network 150 and/or the wired plant automation network 110, for example.

The wireless plant automation network 150 also includes one or more field devices 156, 157, each of which is in some manner equipped for wireless communication with other devices 156, 157, a host station, a portable device, etc. Each of the field devices 156, 157 may be, for example, a valve, a valve positioner, a switch, a sensor (e.g., temperature, pressure, vibration, flow rate, or pH sensor), a pump, a fan, etc., or a combination of two or more such devices. Field devices 156, 157 perform control, monitoring, and/or physical functions within a process or process control loop, such as opening or closing valves or taking measurements of process parameters, for example. In the example wireless plant automation network 150, the field devices 156, 157 are also producers and consumers of wireless communication packets, such as WirelessHART packets. Some or all of the field devices 156, 157 may additionally serve as routers for messages from and to other devices.

The field devices 156 may be WirelessHART devices, meaning that each of field devices 156 is provided as an integral unit supporting all layers of the WirelessHART protocol stack. For example, the field device 156a may be a WirelessHART flow meter, the field devices 156b may be WirelessHART pressure sensors, the field device 156c may be a WirelessHART valve positioner, and the field device 156d may be a WirelessHART vibration sensor. The field device 157a may be a legacy 4-20 mA device, and the field device 157b may be a wired HART device. In the example process control system 100 shown in FIG. 8, each of field devices 157 is connected to the wireless plant automation network 150 via a WirelessHART adaptor (WHA) 158. Each WHA 158 may also support other communication protocols such as FOUNDATION Fieldbus, PROFIBUS, DeviceNet, etc., in which case the WHA 158 supports protocol translation on a lower layer of the protocol stack. A single WHA 158 may additionally function as a multiplexer and support multiple HART or non-HART devices.

Plant personnel may use handheld or portable communication devices, instead of or in addition to a host station, for setup, installation, control, monitoring, and/or maintenance of network devices and other plant equipment. Generally speaking, a portable communication device ("portable communicator") is a portable piece of equipment that can connect directly to a field device 122, 156, 158 via a wireless or a wired connection, or may connect directly to the wireless plant automation network 150, or connect to the wireless plant automation network 150 through the gateway 151. In the example process control system 100 shown in FIG. 8, a portable communicator 125 communicates directly with the field device 122f via a wired connection, and a portable communicator 165 communicates directly with the wireless plant automation network 150. When operating with a formed wireless plant automation network 150, the portable communicator 165 may join the wireless plant automation network 150 as another WirelessHART field device, for example.

When operating with a target network device that is not connected to a WirelessHART network, the portable communicator 165 may operate as a combination of the gateway device 151 and the network manager software module 153 by forming its own WirelessHART network with the target network device. Further, in some embodiments, a field device 122, which is generally a part of the wired automation network 110, may be adapted for wireless communication with a portable communicator (e.g., the portable communicator 165) via a wireless adapter. In general, the term "host" as used herein may refer to any stationary or portable device such as, for example a workstation used for monitoring and controlling field devices, a monitoring station, a portable communicator, that communicates with a field device in any manner using a wireless or a wired connection, or a group of such devices combined in a communication network that is used for communicating with field devices.

Referring again to FIG. 8, the wireless plant automation network 150 of the example process control system 100 also includes a router device 162. The router device 162 is a network device that forwards packets from one network device to another. A network device that is acting as a router uses internal routing tables to determine another network device to which the routing network device should forward a particular packet. Stand-alone routers such as the router 162 may not be required where other devices on the wireless plant automation network 150 support routing. However, it may be beneficial to add the dedicated router 162 to the wireless plant automation network 150 in order to extend the network, for example, or to save the power of field devices in the network.

All devices directly connected to the wireless plant automation network 150 may be referred to as network devices of the wireless plant automation network 150. In particular, the WirelessHART field devices 156, 157, the WHAs 158, the routers 162, the gateway 151, the network access points 155, and the handheld device 165 may, for the purposes of routing and scheduling, be referred to as the network devices of the wireless plant automation network 150. In order to provide a very robust and an easily expandable network, all network devices may support routing and each network device may be globally identified by its HART address. Moreover, the network manager software module 153 may contain a complete list of network devices and assign each device a network-unique name (e.g., a 16-bit name). Further, each network device may store information related to update rates, connection sessions, and device resources. In short, each network device may maintain up-to-date information related to routing and scheduling. In some embodiments, the network manager software module 153 communicates this information to network devices whenever new devices (e.g., new field devices) join the network or whenever the network manager detects or originates a change in topology or scheduling of the wireless plant automation network 150.

In addition to generating, receiving, and/or forwarding data relating to the primary operations of the process control system 100 (e.g., temperature sensor data, data for controlling valve positions, etc.), the devices of the process control system 100 may communicate data relating to maintenance of devices in the process control system 150. For example, a field device may send data to a host when the field device is operating improperly (e.g., when a spool valve of a valve positioner is inoperable), or is at risk of improper operation (e.g., when a voltage of a power module of the device falls below a certain level). As another example, a field device may continuously or periodically send to a host certain data relating to proper operation (e.g., data indicating that certain action or actions have been successfully performed by a field device). The host receiving such data (e.g., the host workstation 111) may display indicators based on that data via a graphical user interface (GUI), thereby allowing a human operator to take the appropriate corrective or preventive measures, or may utilize such data in keeping historical records of equipment and/or processes operation within the process control system 100.

Although FIG. 8 depicts the communication network 100 as including both a wired plant automation network 110 and a wireless plant automation network 150, the communication network 100 may instead include only the wired plant automation network 110 or only the wireless plant automation network 150. In one embodiment, the wireless plant automation network 150 is a wireless mesh communication network.

While various functions and/or systems of field devices have been described herein as "modules," "components," or "function blocks," it is noted that these terms are not limited to single, integrated units. Moreover, while the present invention has been described with reference to specific examples, those examples are intended to be illustrative only, and are not intended to limit the invention. It will be apparent to those of ordinary skill in the art that changes, additions or deletions may be made to the disclosed embodiments without departing from the spirit and scope of the invention. For example, one or more portions of methods described above may be performed in a different order (or concurrently) and still achieve desirable results.

The invention claimed is:

1. A method for verifying measurements obtained from a hall effect sensor in a hall effect sensor system, the method comprising:
    exciting the hall effect sensor with an excitation current having a first value;
    obtaining a first measurement corresponding to a voltage output of the hall effect sensor when the hall effect sensor is excited with the excitation current having the first value;
    exciting the hall effect sensor with the excitation current having a second value, the second value different than the first value;
    obtaining a second measurement corresponding to a voltage output of the hall effect sensor when the hall effect sensor is excited with the excitation current having the second value;
    verifying operation of the hall effect sensor based at least on the first measurement and the second measurement; and
    detecting, by a microprocessor unit of the hall effect sensor system, faults or malfunctions within an analog front end included in the hall effect sensor system, the analog front end configured to receive, condition, and digitize the voltage output of the hall effect sensor.

2. The method of claim 1, further comprising obtaining calibration data for the hall effect sensor, wherein verifying hall effect sensor measurements is further based on the calibration data.

3. The method of claim 2, wherein obtaining calibration data for the hall effect sensor comprises:
    supplying excitation current having the first value to the hall effect sensor;
    obtaining a plurality of measurements corresponding to a plurality of magnetic field strength values applied to the hall effect sensor as the hall effect sensor is excited at the first excitation current value;
    supplying excitation current having the second value to the hall effect sensor; and
    obtaining a plurality of measurements corresponding to the plurality of magnetic field strength values applied to the hall effect sensor as the hall effect sensor is excited at the second excitation current value.

4. The method of claim 3, wherein verifying operation of the hall effect sensor comprises:
    determining, based on stored calibration data, a value of magnetic field corresponding to the first measurement;
    determining, based on stored calibration data, an expected output voltage value corresponding to the determined value of the magnetic field and to the excitation current having the second value;
    comparing the second measurement obtained from the hall effect sensor and the expected output voltage value; and
    determining whether the hall effect sensor measurements are (i) valid or (ii) invalid based on the comparison of the second measurement obtained from the hall effect sensor and the expected output voltage value.

5. The method of claim 1, wherein detecting faults in the analog front end comprises:
    supplying a reference voltage to the analog front end;
    obtaining, from the analog front end, a measurement corresponding to the reference voltage supplied to the analog front end;
    comparing the obtained measurement to a stored measurement obtained from the analog front end when the reference voltage is applied to the analog front end during calibration of the hall effect sensor system; and
    detecting a fault in the analog front end when the obtained measurement does not match the stored measurement.

6. The method of claim 1, wherein the hall effect sensor system is included in a field device operating in a process control system.

7. The method of claim 1, wherein verifying operation of the hall effect sensor includes determining that measurements obtained from the hall effect sensor are one of i) valid or ii) invalid, the method further comprising, in response to determining that measurements obtained from the hall effect sensor are not valid, setting operation of the field device to a safe mode.

8. The method of claim 6, wherein the field device operating in the process control system is a digital level controller.

9. The method of claim 7, further comprising communicating an alarm signal to a host station when it is determined that measurements obtained from the hall effect sensor are not valid.

10. A hall effect sensor system for use in a field device operating in a process control system, comprising
    a hall effect sensor;
    a current driver coupled to the hall effect sensor and configured to supply excitation current to the hall effect sensor;
    an analog front end configured to receive, condition, and digitize voltage outputs of the hall effect sensor; and
    a microcontroller coupled to the current driver, the microcontroller configured to:
        control the current driver to supply excitation current having a first value to the hall effect sensor;
        obtain a first measurement corresponding to a voltage output of the hall effect sensor when the hall effect sensor is excited with the excitation current having the first value;
        control the current driver to supply excitation current having a second value to the hall effect sensor, the second value different than the first value;

obtain a second measurement corresponding to a voltage output of the hall effect sensor when the hall effect sensor is excited with the excitation current having the second value;

verify operation of the hall effect sensor based at least on the first measurement and the second measurement; and detect faults or malfunctions within the analog front end.

11. The hall effect sensor system of claim 10, wherein the microcontroller is further configured to obtain calibration data for the hall effect sensor, wherein verifying hall effect sensor measurements is further based on the calibration data.

12. The hall effect sensor system of claim 11, wherein the microcontroller is configured to obtain calibration data for the hall effect sensor at least by:

controlling the current driver to supply excitation current having the first value to the hall effect sensor;

obtaining a plurality of measurements corresponding to a plurality of magnetic field strength values applied to the hall effect sensor as the hall effect sensor is excited at the first excitation current value;

controlling the current driver to supply excitation current having the second value to the hall effect sensor; and obtaining a plurality of measurements corresponding to the plurality of magnetic field strength values applied to the hall effect sensor as the hall effect sensor is excited at the second excitation current value.

13. The hall effect sensor system of claim 12, wherein the microcontroller is configured to:

determine, based on stored calibration data, a value of magnetic field corresponding to the first measurement;

determine, based on stored calibration data, an expected output voltage value corresponding to the determined value of the magnetic field and to the excitation current having the second value;

compare the second measurement obtained from the hall effect sensor to the expected output voltage value; and determine whether the hall effect sensor measurements are (i) valid or (ii) invalid based on the comparison of the second measurement obtained from the hall effect sensor and the expected output voltage value.

14. The hall effect sensor system of claim 10, wherein the microcontroller is coupled to the hall effect sensor via the analog front end.

15. The hall effect sensor system of claim 14, further comprising a switch connected between the hall effect sensor and the analog front end, and wherein the microcontroller is configured to:

control the switch to switch input of the analog front from an output of the hall effect sensor to a reference voltage;

obtain a measurement of the reference voltage signal from the analog front end;

compare the obtained measurement to a stored measurement obtained from the front end when the reference voltage is applied to the front end during calibration of the hall effect sensor system; and detect a fault in the analog front end when the obtained measurement does not match the stored measurement.

16. The hall effect sensor system of claim 10, wherein the microcontroller is configured to determine that measurements of the hall effect sensor are one of i) valid or ii) invalid, and, in response to determining that measurements of the hall effect sensor are not valid, set operation of the field device to a safe mode.

17. The hall effect sensor system of claim 10, wherein the microcontroller is further configured to cause an alarm signal to be transmitted to a host station when it is determined that the hall effect sensor measurements are not valid.

18. A process control system, comprising:

a field device comprising a hall effect sensor system configured to measure a process variable in the processes control system, wherein the hall effect sensor system includes a hall effect sensor, a current driver coupled to an excitation input of hall effect sensor;

an analog front end configured to receive, condition, and digitize voltage outputs of the hall effect sensor; and a microcontroller coupled to the current driver, the microcontroller configured to:

control the current driver to supply excitation current having a first value to the hall effect sensor;

obtain a first measurement corresponding to a voltage output of the hall effect sensor when the hall effect sensor is excited with the excitation current having the first value;

control the current driver to supply excitation current having a second value to the hall effect sensor, the second value different than the first value;

obtain a second measurement corresponding to a voltage output of the hall effect sensor when the hall effect sensor is excited with the excitation current having the second value;

verify operation of the hall effect sensor based at least on the first measurement and the second measurement; and detect faults or malfunctions within the analog front end.

19. The process control system of claim 18, wherein the field device is a digital level controller, and wherein the process variable is one of (i) level of liquid in a tank, (ii) level of interface between multiple liquids in a tank or (iii) density of a liquid in a tank.

* * * * *